United States Patent [19]
Ito

[11] Patent Number: 5,598,555
[45] Date of Patent: Jan. 28, 1997

[54] DATA TRANSMISSION APPARATUS

[75] Inventor: Masahiro Ito, Hamamatsu, Japan

[73] Assignee: Yamaha Corporation, Hamamatsu, Japan

[21] Appl. No.: 364,359

[22] Filed: Dec. 27, 1994

[30] Foreign Application Priority Data

Dec. 28, 1993 [JP] Japan ................... 5-349735
Dec. 28, 1993 [JP] Japan ................... 5-349736

[51] Int. Cl.$^6$ .................................................. G06F 1/14
[52] U.S. Cl. ..................... 395/557; 395/891; 395/558; 364/270; 364/270.2; 364/271.5; 364/238.7; 364/239.2; 364/DIG. 1
[58] Field of Search ................... 395/550, 891, 395/872, 880, 881; 364/270, 270.2, 271.5, 238.7, 239.2

[56] References Cited

U.S. PATENT DOCUMENTS

| | | | |
|---|---|---|---|
| 4,829,421 | 5/1989 | Ritchie | 364/200 |
| 5,168,556 | 12/1992 | Lajtai et al. | 395/325 |
| 5,247,652 | 9/1993 | Uda | 395/500 |
| 5,519,444 | 5/1996 | Ko et al. | 348/515 |

Primary Examiner—Thomas M. Heckler
Assistant Examiner—Dennis M. Butler
Attorney, Agent, or Firm—Loeb & Loeb LLP

[57] ABSTRACT

A data transmission apparatus has a timer circuit disposed to have time data input thereto. The time data specifies a time interval of transmission of main data which forms parallel data together with the time data. The timer circuit counts the time interval specified by the time data input thereto to generate a time-up signal upon completion of counting the time interval, and has next one of the time data input thereto upon generation of the time-up signal. A transmission clock-generating circuit frequency-divides a predetermined system clock to generate a transmission clock signal, and is responsive to the time-up signal delivered from the timer circuit, for correcting the phase of the transmission clock signal. A serial data transmission circuit is responsive to the time-up signal delivered from the timer circuit, for having the parallel data input thereto, and for converting the parallel data into serial data, based on the transmission clock signal delivered from the transmission clock-generating circuit, to deliver the serial data.

9 Claims, 11 Drawing Sheets

DATA TRANSMISSION APPARATUS

BACKGROUND OF THE INVENTION

1. Field of the Invention

This invention relates to a data transmission apparatus which converts parallel data, of which transmission data items each have a fixed length, and transmission timing is designated as desired, into serial data at designated timing, to deliver the serial data.

2. Prior Art

A serial data transmission method in which transmission data and timing data determining the transmission timing of the transmission data are read as a pair of parallel data, and then the transmission data is converted into data in a serial form, and transmit the same at designated timing, is widely used, e.g. in transmission of MIDI (Musical Instrument Digital Interface) data and the like. In this kind of data transmission method, how to realize transmission time intervals (hereinafter referred to as "transmission intervals") with accuracy is important, not to mention the contents of data to be transmitted. Conventionally, the transmission intervals are accurately controlled by means of software to input and output the transmission data.

However, the conventional method using software to control the transmission intervals suffers from a problem that interrupt processing to measure the transmission intervals causes an increased load on a CPU (Central Processing Unit) which controls the data transmission by the software. Further, according to the conventional method, it is not necessarily possible to obtain accurate and faithful data transmission intervals due to a delay time occurring in processing by a transmission circuit, a phase difference between the transmission timing and a shift clock for serial transmission, and so forth.

On the other hand, although the timing data (hereinafter referred to as "time data") specifying the transmission intervals and the transmission data (hereinafter referred to as "the main data") which is transmitted upon lapse of each transmission interval specified by the time data are given to a data transmission apparatus which implements the method, as a pair of parallel data items as mentioned above, the timing of start of measurement of the transmission interval specified by the timing data and the timing of transmission of the main data are different from each other in themselves, which increases load on the CPU for adjustment of the timing. Further, although a memory can be provided as a data buffer for the adjustment of the timing, there still remains a problem that even in such a case there is a difference in timing between readout of the time data and readout of the main data, which complicates the hardware construction and the address control.

SUMMARY OF THE INVENTION

It is a first object of the invention to provide a data transmission apparatus which is capable of reducing load on the CPU and realizing accurate time intervals of data transmission.

It is a second object of the invention to provide a data transmission apparatus which is capable of reducing load on the CPU and realizing accurate data transmission with a simple circuit configuration.

To attain the above objects, in a first aspect of the invention, there is provided a data transmission apparatus comprising a timer circuit disposed to have time data input thereto, the time data specifying a time interval of transmission of main data forming parallel data together with the time data, the timer circuit counting the time interval specified by the time data input thereto to generate a time-up signal upon completion of counting the time interval, and having next one of the time data input thereto upon generation of the time-up signal, a transmission clock-generating circuit for frequency-dividing a predetermined system clock to generate a transmission clock signal, the transmission clock-generating circuit being responsive to the time-up signal delivered from the timer circuit, for correcting a phase of the transmission clock signal, and a serial data transmission circuit responsive to the time-up signal delivered from the timer circuit, for having the parallel data input thereto, and for converting the parallel data into serial data, based on the transmission clock signal delivered from the transmission clock-generating circuit, to deliver the serial data.

According to the above construction, the timer circuit accurately measures the time interval of transmission of the main data to generate the time-up signal, in response to which the timing of the data transmission is determined. At the same time, the phase of the transmission clock is corrected in response to the time-up signal, whereby no timing error in the data transmission occurs, enabling transmission of the serial data accurately at designated timing. Further, the CPU need not control the transmission intervals but has only to supply the time data and the transmission data at somewhat free timing, whereby the load on the CPU is largely reduced.

Preferably, the data transmission apparatus further includes a control device for determining whether the serial data is being transmitted, and for delaying timing of the inputting of next one of the time data to the timer circuit, timing of the correction of the phase of the transmission clock signal, and timing of the inputting of the parallel data to the output circuit until completion of transmission of the serial data, if the serial data is being transmitted when the time-up signal is delivered from the timer circuit.

That is, when the time-up signal is generated during transmission of the serial data, the control device operates to delay the timing of the inputting of the next time data to the timer circuit and the timing of the phase correction of the transmission clock until the transmission of the serial data is completed. As a result, even with generation of a demand for transmission of the next data, there is no possibility that the data being currently transmitted is destroyed, enabling continual transmission of the serial data.

In a second aspect of the invention, there is provided a data transmission apparatus comprising a data buffer for simultaneously storing time data specifying a time interval of transmission of main data and the main data to be transmitted upon lapse the time interval specified by the time data, as a pair of parallel data, and for simultaneously reading out the pair of parallel data therefrom, a timer circuit disposed to have input thereto the time data of the pair of the parallel data read out from the data buffer, the timer circuit counting the time interval specified by the time data input thereto to generate a time-up signal upon completion of counting the time interval, and having next one of the time data input thereto upon generation of the time-up signal, a holding device responsive to the time-up signal, for storing the main data of the pair of the parallel data read out from the data buffer, and an output circuit responsive to the time-up signal, for having the main data from the holding device input thereto in a parallel manner, and for converting the main data into serial data, to thereby output the serial data.

With the above construction, adjustment of the timing of starting the measurement of the time data and the timing of transmission of the main data is carried out by simultaneously writing the time data and the main data into the data buffer and simultaneously reading out them therefrom, and then delivering the main data to the output circuit after once storing it in the holding device. Therefore, access to the data buffer for the time data and the main data can be made at the same time. As a result, the memory for the time data and one for the main data can be implemented by a single memory, while facilitating the address control, whereby the apparatus can be designed simple in construction and small in size.

Preferably, the data transmission apparatus includes a first register responsive to a first write signal, for storing the time data of the pair of the parallel data, and a second register responsive to a second write signal, for storing the main data of the pair of the parallel data;

the data buffer including write address-generator for generating a write address, and read address-generator for generating a write address, and wherein the data buffer reads the time data stored in the first register and the main data stored in the second register and updates the write address generated by the write address-generator, in response to the second write signal, while permitting the reading-out of the time data and the main data and updating the read address generated by the read address-generator, in response to the time-up signal.

Since in addition to the simultaneous access to the data buffer for the time data and the main data, the write address and the read address are updated or incremented by the signals determining the timing of reading and writing from and into the data buffer, the address control can be carried out in a more simple manner.

Preferably, the data transmission apparatus further includes a control device for determining whether the data buffer is in an empty state, the control device being responsive to first generation of the time-up signal when the data buffer is in the empty state, for transferring the main data remaining in the holding device to the output circuit, and then inhibiting transfer of next one of the main data to the output circuit until the data buffer ceases to be in the empty state.

That is, when the time-up signal is first generated while the data buffer is in an empty state where no unread data is stored therein, the main data remaining in the holding device is transferred to the output circuit and then transfer of subsequent main data to the output circuit is inhibited until the data buffer ceases to be empty. As a result, it can be avoided that wrong data are transmitted after transmission of the last data of a group of data is completed.

Preferably, the data transmission apparatus further includes a control device for determining whether the data buffer is in an empty state, the control device being responsive to first writing of the parallel data into the data buffer when the data buffer is in the empty state, for immediately reading the parallel data from the data buffer, to thereby store the time data into the timer circuit and the main data into the holding device, and at the same time inhibiting transfer of the main data from the holding device to the output circuit.

That is, when the parallel data are first written into the data buffer while the data buffer is in the empty state, the parallel data are immediately read out from the data buffer, and then the time data is stored into the timer circuit and the main data is stored into the holding device, while inhibiting transfer of the main data from the holding device to the output circuit. As a result, in transmitting the first data of a group of data, the data transmission can be started in a continual manner without requiring any special processing such as inputting of a reset signal.

The above and other objects, features, and advantages of the invention will become more apparent from the following detailed description taken in conjunction with the accompanying drawings.

DETAILED DESCRIPTION

The invention will be now described in detail with reference to the drawings showing preferred embodiments thereof.

Figure 1:
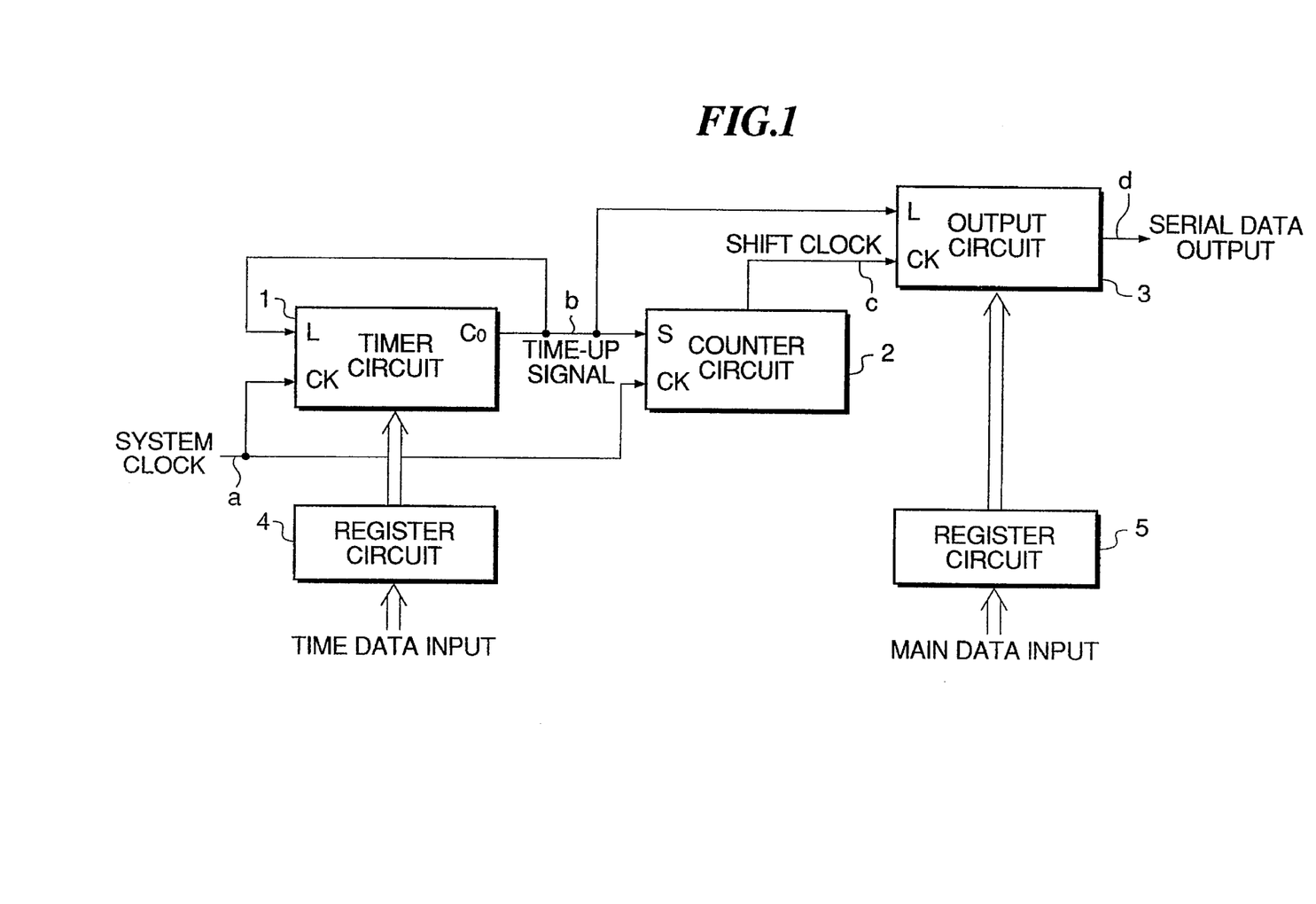
FIG. 1 is a block diagram showing the arrangement of a data transmission apparatus according to a first embodiment of the invention.

FIG. 1 shows the arrangement of a data transmission apparatus according to a first embodiment of the invention, which is adapted to receive time data and main data, and effects parallel-to-serial conversion of the main data, at transmission intervals specified by the time data, to deliver the resulting serial data. The apparatus is comprised of a timer circuit 1, a counter circuit 2, an output circuit 3, and two register circuits 4 and 5.

Data which are input to this apparatus are supplied from a CPU, not shown, which are parallel data formed by pairs of time data and main data, each pair being formed of a time data item and a transmission data item. The time data item designates a time interval before the next transmission of the main data, and the main data item has a fixed length, e.g. a one word or one byte.

The time data and the main data are stored into the register circuits 4, 5, respectively. The time data stored in the register circuit 4 is loaded into the timer circuit 1 whenever a time-up signal b is applied to a terminal L of the timer circuit 1. The timer circuit 1, when supplied with a new time data item, starts to count down a time period specified by the time data item, based on a high-speed system clock a input thereto via a terminal CK thereof. When the count of the timer circuit 1 becomes equal to 0, the timer circuit 1 delivers the time-up signal b, which is applied to the terminal L thereof, so that at the same time permits the next time data item to be loaded thereinto. The time-up signal b is also supplied to the counter circuit 2 and the output circuit 3.

The counter circuit 2 constitutes a transmission clock-generating circuit, and carries out counting operation based on the high-speed system clock a, similarly to the timer circuit 1. The counter circuit 2 is set or reset in response to inputting of the time-up signal b thereto, and frequency-divides the system clock into a shift clock c timed to a desired frequency as a transmission clock. The shift clock c is supplied to the output circuit 3.

The output circuit 3, which is formed e.g. by a shift register or the like, is responsive to the time-up signal b applied to a terminal L thereof to have the main data from the register circuit 5 loaded thereinto in a parallel manner, and then serially delivers the main data in response to the shift clock c applied thereto via a terminal CK thereof from the counter circuit 2.

Figure 2:
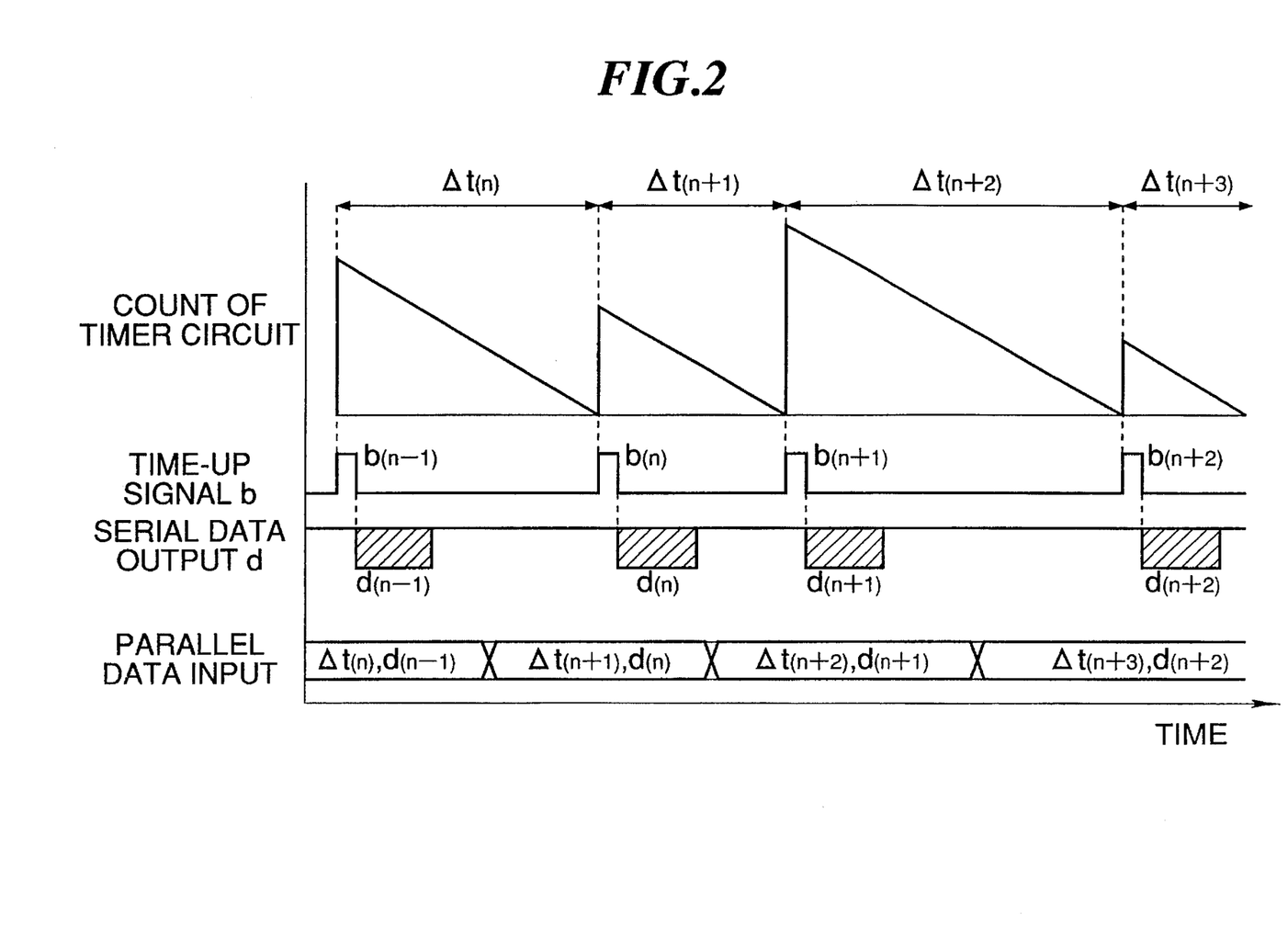
FIG. 2 is a timing chart showing the operation of the FIG. 1 apparatus.

FIG. 2 shows details of the operation of the serial transmission apparatus, which is executed in receiving the parallel data.

The CPU supplies parallel data formed by a time data item $\Delta t(i+1)$ ($i = \ldots, n-1, n, n+1 \ldots$, and so forth) and a main data item $d(i)$ ($i = \ldots, n-1, n, n+1, \ldots$, and so forth) to the data transmission apparatus. The parallel data can be input to the apparatus at any timing between the end of transmission of data di-1 and the next generation of the time-up signal b. The data items from the CPU are held in the register circuits 4 and 5 until the next pair of data items are received. If the time-up signal b is generated before the next pair of data items are received, the time data item $\Delta t(i)$ is loaded into the timer circuit 1 immediately upon rising of the time-up signal, and at the same time the timer circuit 1 starts to count down. When the count of the timer circuit 1 becomes equal to 0, the next pulse of the time-up signal b is generated simultaneously, whereby the next time data item $\Delta t(i+1)$ is loaded into the timer circuit 1.

The time data item $\Delta(i)$ is defined in the present embodiment as data indicative of a time interval of transmission between the last main data item $d(i-1)$ and the present main data item $d(i)$. However, if the time data item $\Delta t(i)$ is defined as data indicative of a time interval of transmission between the present main data item di and the next main data item $d(i+1)$, the data items $\Delta t(i)$ and $d(i)$ should be simultaneously loaded into the respective circuits 1, 3.

Figure 3:
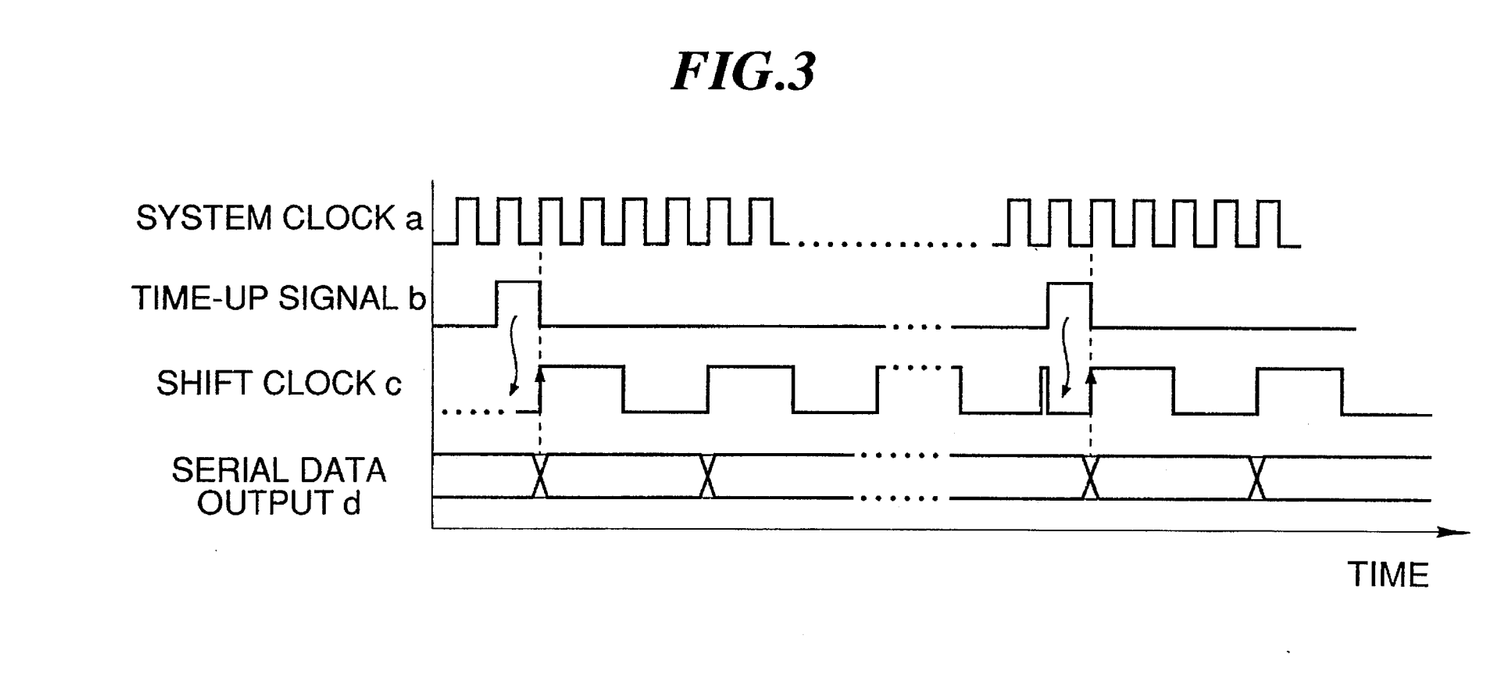
FIG. 3 is a timing chart showing the operation of the FIG. 1 apparatus.

FIG. 3 shows details of the operation of the data transmission apparatus executed in transmitting the serial data.

The time-up signal b and the shift clock c are both synchronous with the high-speed system clock a. However, since the shift clock c is a low-speed clock obtained by frequency-dividing the system clock a, the time-up signal b and the system clock c are not necessarily sychronous in phase with each other. To eliminate this inconvenience, in the present embodiment, the shift clock c from the counter circuit 2 is reset by the leading edge of the time-up signal b and set by the trailing edge of the same, whereby the phase of the shift clock c is forcedly corrected to coincide with the phase of the time-up signal b immediately after generation of the time-up signal b.

As a result, an uncertain delay in the processing, a phase error due to asynchronism between the shift clock c and the time-up signal b, etc. can be prevented, thereby realizing accurate and faithful time intervals of data transmission.

Figure 4:
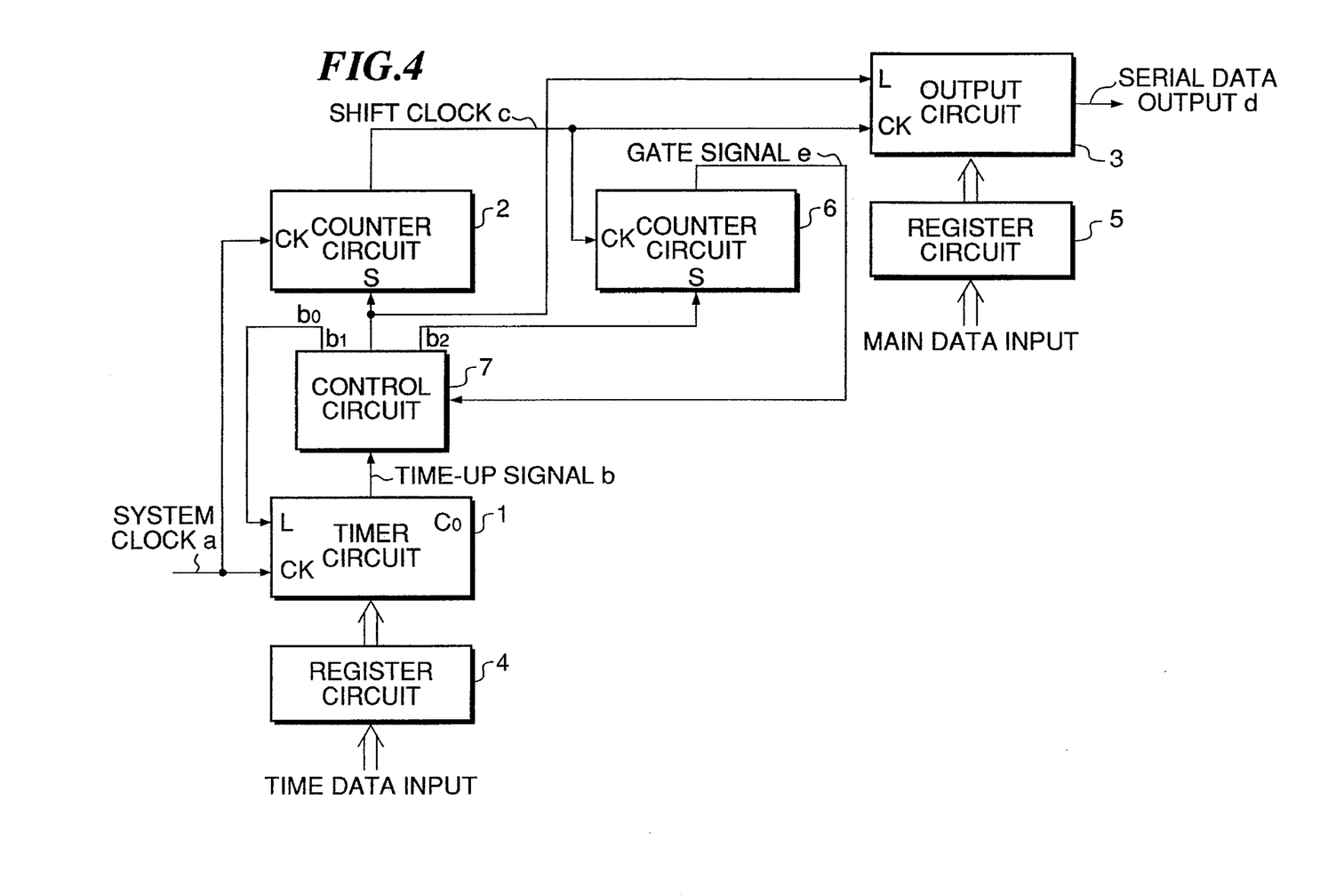
FIG. 4 is a block diagram showing the arrangement of a data transmission apparatus according to a second embodiment of the invention.

FIG. 4 shows a data transmission apparatus according to a second embodiment of the invention. In the figure, component elements and parts corresponding to those of the first embodiment are designated by identical reference numerals.

The present embodiment is distinguished from the above described first embodiment in that a counter circuit 6 and a control circuit 7 are additionally provided as control means for delaying the timing of loading of new parallel data and phase correction of the shift clock until the end of transmission of serial data, if the serial data is still being transmitted when the time-up signal b is delivered from the timer circuit 1.

The counter circuit 6 operates to hold a gate signal e ON from the start of transmission of serial data to the end of the same, and to this end, counts the shift clock c applied to a terminal CK thereof e.g. up to a number of bits corresponding to one word. The control circuit 7 delivers control signals b0, b1, and b2, based on the time-up signal b from the timer circuit 1 and the gate signal e from the counter circuit 6.

Figure 5:
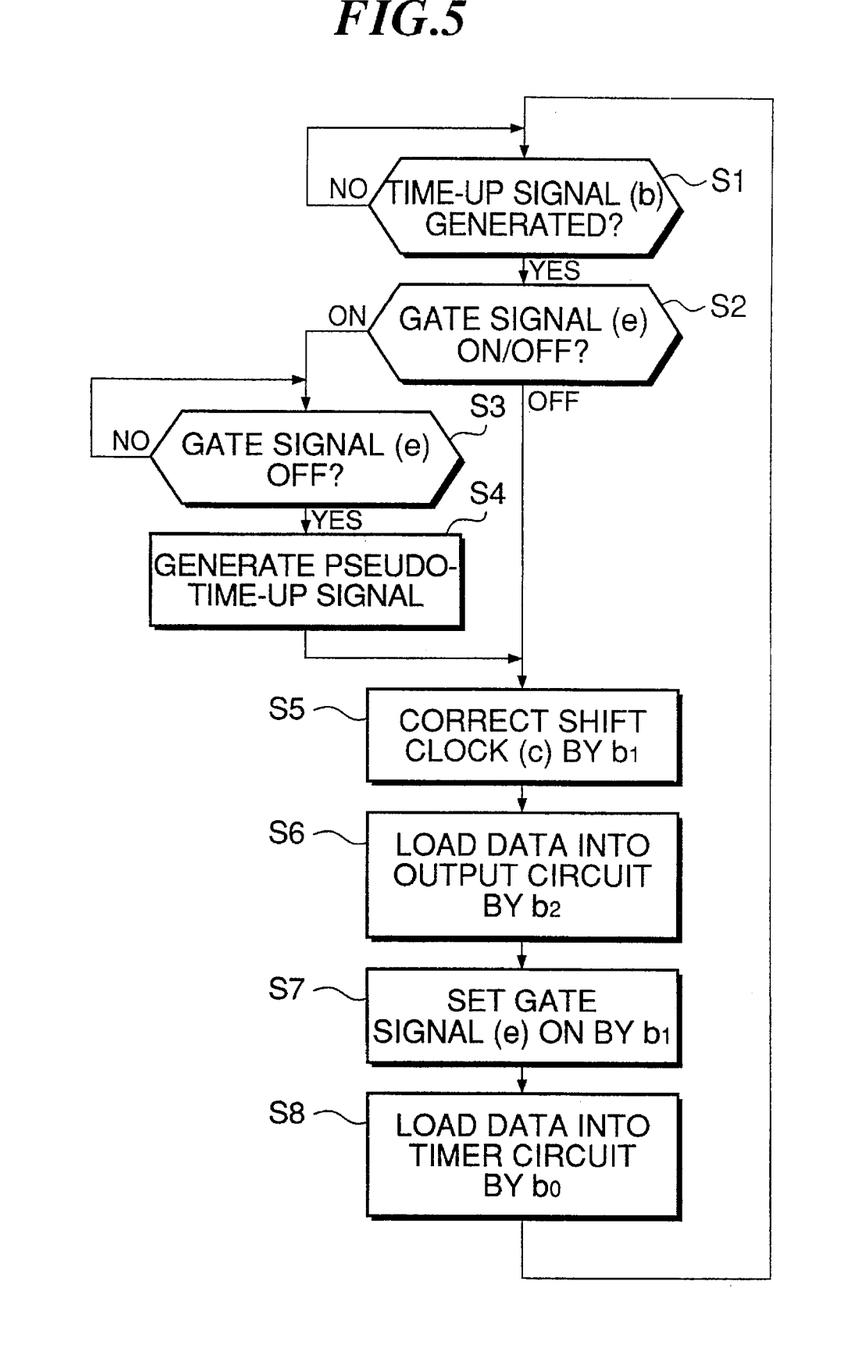
FIG. 5 is a flowchart showing a program for control processing executed by a control circuit appearing in FIG. 4.

FIG. 5 shows a program for control processing executed by the control circuit 7.

If the control circuit 7 detects generation of the time-up signal b at a step S1, it determines at a step S2 whether or not the gate signal e is ON or OFF. If the gate signal e is ON, the control circuit 7 waits for the gate signal e to turn OFF at a step S3. When the gate signal e is turned off, the control circuit 7 generates a pseudo time-up signal b' which is used to output below-mentioned control signals (see FIG. 6), at a step S4. At the same time, the control circuit 7 B delivers the above-mentioned control signal b1 to to the counter circuit 2 to correct the phase of the shift clock c at a step S5, also delivers the control signal b1 to the output circuit 3 to load the main data into the same at a step S6, the control signal b2 to the counter circuit 6 to turn the gate signal e ON at a step S7, and the control signal b0 to the timer circuit 1 to load the next time data into the same at a step S8. On the other hand, if it is determined at the step S2 that the gate signal e is OFF, the control circuit 7 3B immediately delivers the control signals b0 to b2 to thereby effect operations similar to those described in the first embodiment, at the steps S5 to S8.

Figure 6:
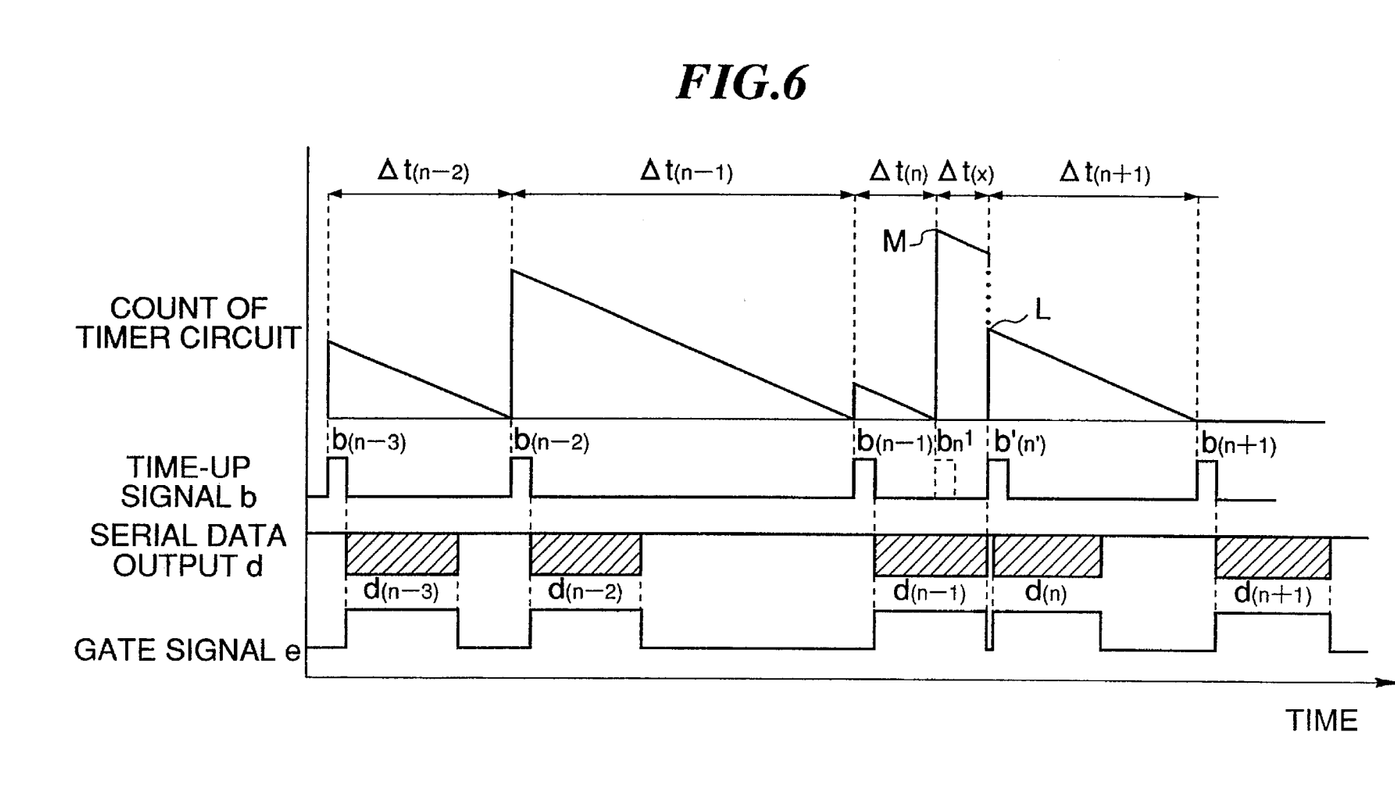
FIG. 6 is a timing chart showing the operation of the FIG. 4 apparatus.

By the above processing, as shown in FIG. 6, even if the time-up signal b(n) is generated during transmission of serial data item d(n−1), the start of transmission of the next serial data item d(n) is delayed until the end of transmission of the serial data item d(n−1), more specifically, it is delayed from the time the gate signal e from the counter circuit 6 indicative of transmission of serial data is turned off to the time the pseudo time-up signal b' is formed and generated by the control circuit 7, thereby making it possible to continually transmit the data transmission without destroying the data. On this occasion, no new-time data is loaded into the timer circuit 1, which accordingly makes a free run as indicated by line M in the figure, but when the transmission of the serial data item d(n−1) is completed, the gate signal e is turned OFF, and then the control signal b0 causes the next time data item $\Delta(n+1)$ to be loaded into the timer circuit 1 as indicated by line L in the figure, thus causing no hindrance to the operation of the present data transmission apparatus.

The above phenomenon of generation of the time-up signal b during transmission of the serial data occurs when a time interval specified by the time data item $\Delta t(n)$ is shorter than a time period required for transmission of one word of the serial data d. This can be caused, e.g. by an error in the counting operation for generation of the time data in the case of transmitting lengthy serial data. According to the present embodiment, even if the time data contains such an error, the transmission data is prevented from becoming faulty, whereby it is possible to carry out transmission of transmission data by constantly maintaining normal time intervals of transmission.

Figure 7:
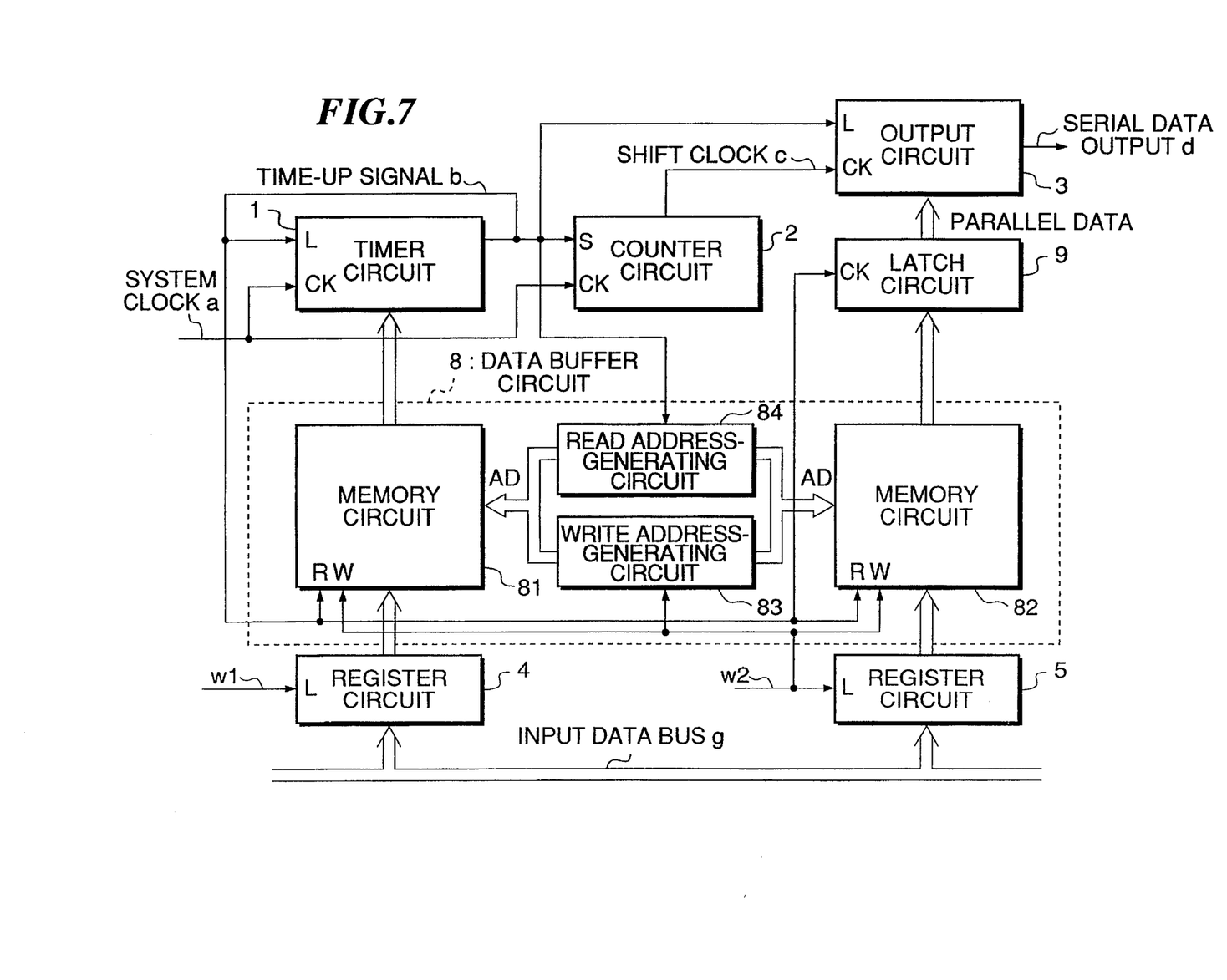
FIG. 7 is a block diagram showing the arrangement of a data transmission apparatus according to a third embodiment of the invention.

FIG. 7 shows the arrangement of a data transmission apparatus according to a third embodiment of the invention, which receives time data and main data and delivers the main data at transmission intervals specified by the time data, thereby effecting parallel-to-serial conversion to deliver the resulting serial data, similarly to the above described embodiments. The apparatus is distinguished from the aforedescribed first embodiment in that it further includes a data buffer circuit 8, and a latch circuit 9, in addition to the timer circuit 1, the frequency divider circuit 2, the output circuit 3, and the register circuits 4 and 5 employed in the first embodiment. In the figure, component elements and parts corresponding to those of the first embodiment are designated by identical reference numerals The time data is stored into the register circuit 4 by a time data write signal w1, while the main data is stored into the register circuits 5 by a main data write signal w2. The time data and the main data stored in the register circuits 4 and 5 are written into memory circuits 81 and 82 of the data buffer circuit 8 by a memory write signal w. The memory circuits 81 and 82 write in the data according to a write address delivered from a write address-generating circuit 83, and read out the data according to a read address delivered from a read address-generating circuit 84. The write address-generating circuit 83 increments the write address in response to inputting of the memory write signal w thereto, while the read address-generating circuit 84 increments the read address in response to inputting of the time-up signal b thereto. Although the memory circuits 81 and 82 are shown in the figure and described as different or separate circuits, they may be provided at different storage areas of the same memory device, because the time data and the main data are stored into the same address of the memory circuits 81, 82.

The time data read from the data buffer circuit is loaded into the timer circuit 1. The timer circuit 1, when supplied with a time data item, starts to count-down a time interval specified by the time data item, based on the high-speed system clock a input thereto via the terminal CK thereof. When the count of the timer circuit 1 becomes equal to 0, the time-up signal b is delivered from the timer circuit 1, and at the same time the next time data item is loaded into the timer circuit 1. The time-up signal b not only serves as a memory read signal applied to the data buffer circuit 8, but also is supplied to the counter circuit 2 and the output circuit 3.

Except for those described above, the present embodiment is substantially identical in construction with the aforedescribed first embodiment, and description of which is therefore omitted.

Figure 8A:
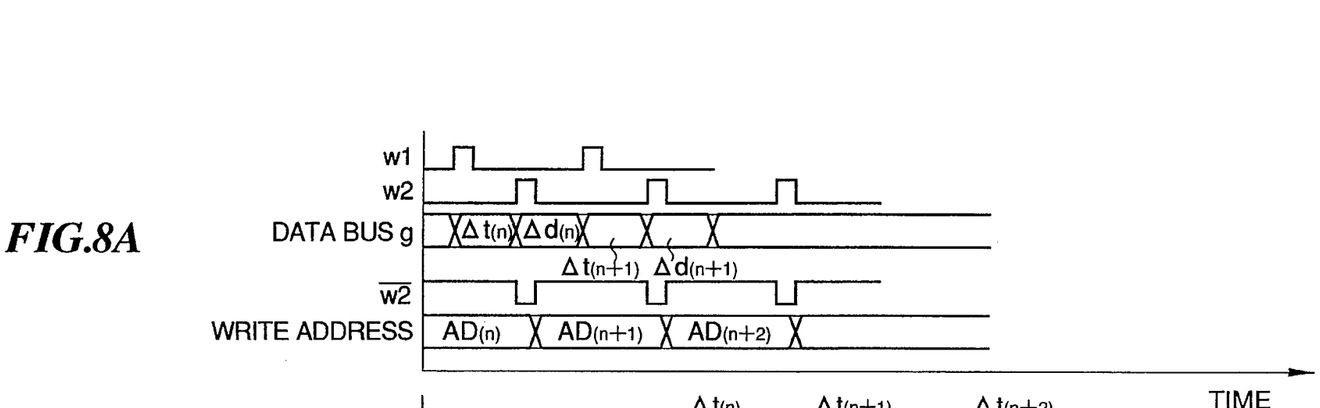
FIG. 8A and FIG. 8B are timing charts showing the operation of the FIG. 7 apparatus.
Figure 8B:
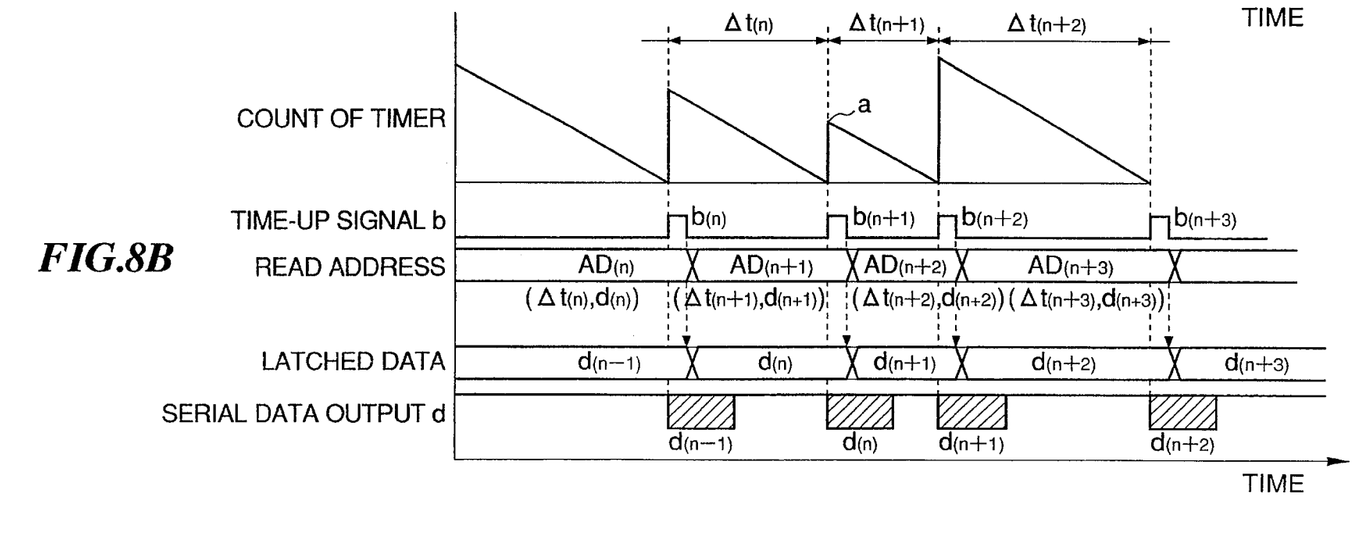

FIG. 8A and FIG. 8B show details of the operation of the data transmission apparatus according to the present embodiment.

The CPU, not shown, alternately supplies a time data item $\Delta(i)$ ($i = \ldots, n-1, n, n+1, \ldots$, and so forth) and a main data item $d(i)$ ($i = \ldots, n-1, n, n+1, \ldots$, and so forth) to the data transmission apparatus via an input data bus g. The time data item $\Delta(i)$ is written into the register circuit 4 when the write signal w1 is applied to a terminal L thereof, while the main data item $d(i)$ is written into the register circuit 5 when the write signal w2 is applied to a terminal L thereof. If the write signal w2 is delayed 35 relative to the write signal w1, generation of the write signal w2 causes these two data items $\Delta t(i)$ and $d(i)$ to be aligned with each other between the register circuits 4 and 5. Therefore, an inverted signal of the write signal w2 is used as the memory write signal to permit the data to be written into the memory circuits 81 and 82, When the data are written into the memory circuits 81, 82, a write address AD(i) from the write address-generating circuit 83 is incremented immediately thereafter. The writing operations into the memory circuits 81, 82 can be executed independently of the reading operations. Therefore, the time data item and the main data item can be supplied at any timing.

On the other hand, when the time-up signal b is generated from the timer circuit 1, the latch circuit 9 operates in response to the time-up signal b to load main data item $d(i-1)$ stored therein into the output circuit 3, thereby starting transmission of serial data. Then, the time data item $\Delta(i)$ and the main date item $d(i)$ are simultaneously read from the memory circuits 81 and 82, whereby the time data $\Delta t(i)$ is loaded into the timer circuit 1 and the main data $d(i)$ is stored into the latch circuit 9. Then, the read address AD(i) from the read address-generating circuit 84 is incremented.

The timer circuit 1 starts count-down operation immediately upon loading of the time data item $\Delta t(1)$ thereinto. When the count of the timer circuit 1 becomes equal to 0, the next time-up signal b is generated, followed by execution of similar processing to that described above on the data input the next time.

Thus, the writing and reading operations of the time data to and from the data buffer circuit 8 are carried out simultaneously with those of the main data, thereby facilitating setting of timing of the reading and writing operations and generation of addresses, which contributes to simplification of the circuit configuration of the data transmission apparatus.

Also in the present embodiment, similarly to the previous embodiments, the shift clock c from the counter circuit 2 is reset by the leading edge of the time-up signal b and set by the trailing edge of the same, whereby the phase of the shift clock c is forcedly corrected to coincide with the phase of the time-up signal b immediately after generation of the latter (see FIG. 3), thereby preventing an uncertain delay in the processing, a phase error due to asynchronism between the shift clock c and the time-up signal b, etc. and hence realizing accurate and faithful time intervals of data transmission.

Figure 9:
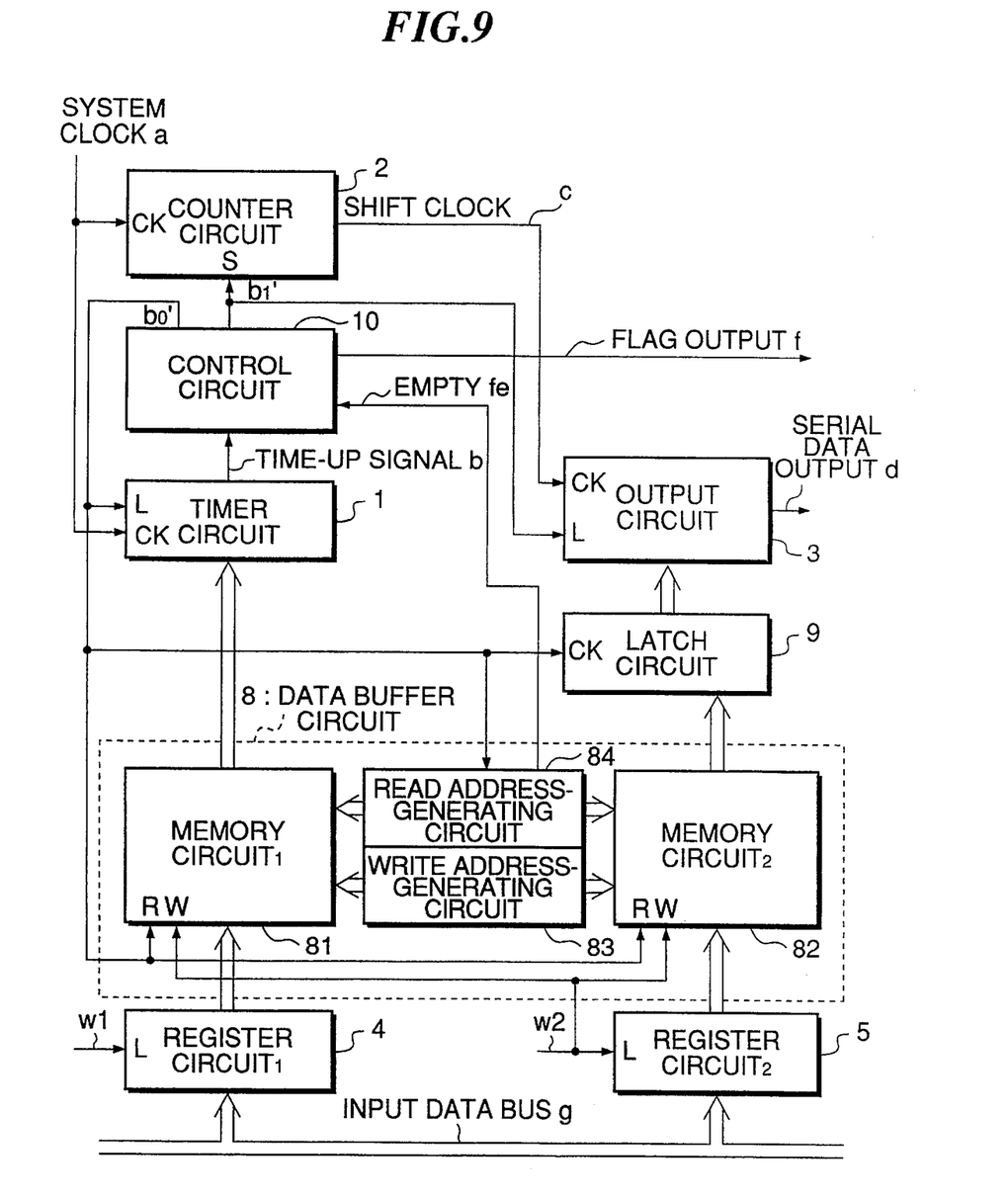
FIG. 9 is a block diagram showing the arrangement of a data transmission apparatus according to a fourth embodiment of the invention.

FIG. 9 shows the arrangement of a data transmission apparatus according to a fourth embodiment of the invention. In the figure, component elements and parts corresponding to those of the third embodiment in FIG. 7 are designated by identical reference numerals.

The present embodiment is distinguished from the above described third embodiment in that a control circuit 10 is additionally provided to inhibit data from being loaded into circuits when the data buffer circuit 8 is empty or contains no unread data.

That is, the data buffer circuit 8 delivers an "empty" signal fe indicative of an empty status thereof which is determined, e.g. through comparison of addresses between the write address-generating circuit 83 and the read address-generating circuit 84. The control circuit 10 delivers control signals b0', b1' and a flag f, based on the "empty" signal fe and the time-up signal b from the timer circuit 1.

The control signal b0' serves to control loading of time data into the timer circuit 1, reading of data from the data buffer circuit 8 (memory circuits 81, 82), incrementing of read addresses from the read address-generating circuit 84, and latching of main data into the latch circuit 9. The control signal b1' serves to control phase correction of the shift clock from the counter circuit 2 and loading of main data into the output circuit 3. Further, the flag f is made active (ON) or set to a value of 1, when the time-up signal b as a data transmission demand signal is generated when the memory circuits 81, 82 are empty. The flag f serves as an end-discriminating signal to indicate completion of transmission of a predetermined group of data items, as well as an error signal indicative of a software error that writing of new data items into the register circuits 4, 5 is not effected before completion of transmission of a predetermined group of data items.

Figure 10:
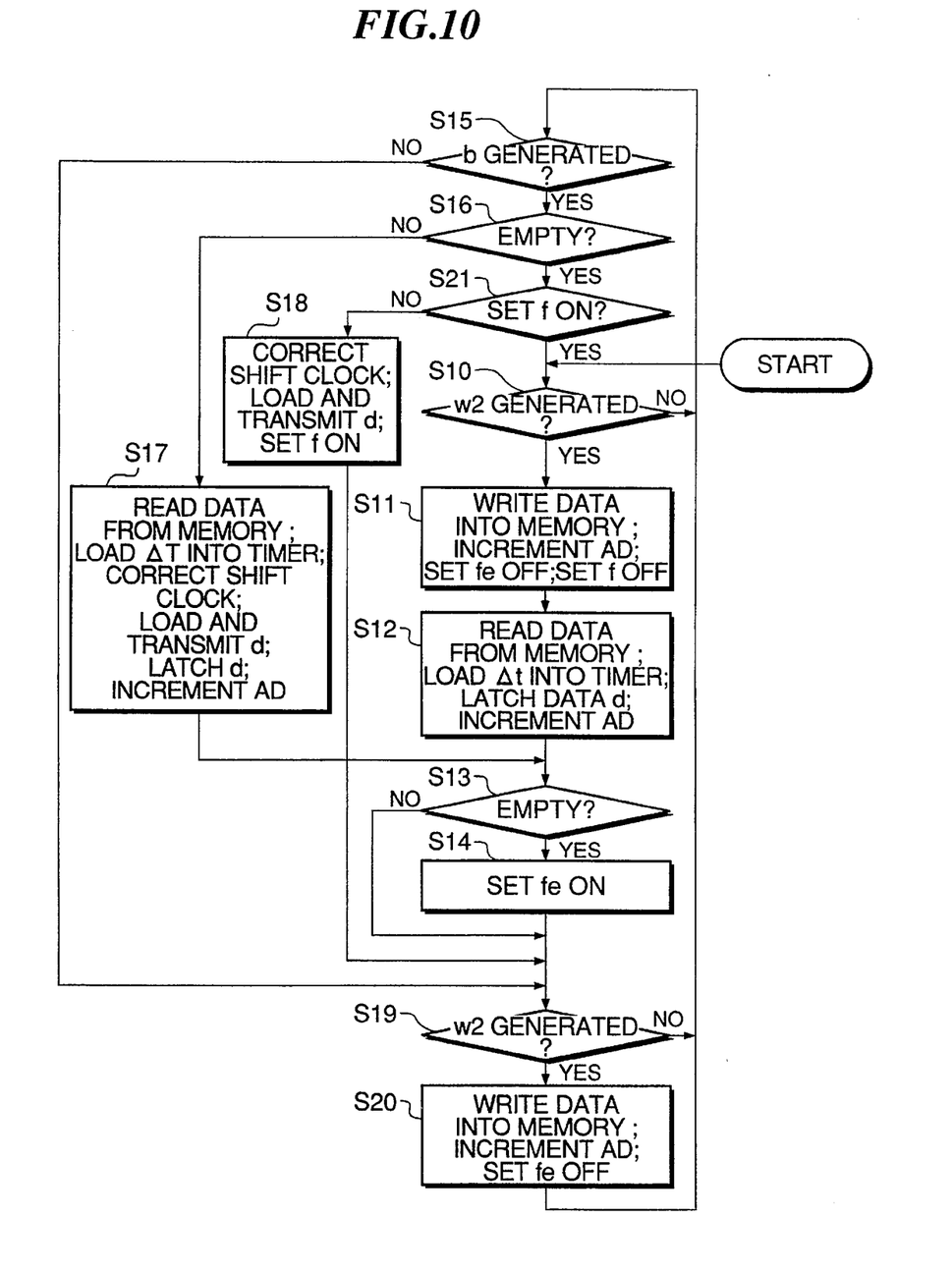
FIG. 10 is a flowchart showing a program for processing executed by a control circuit appearing in FIG. 9.

FIG. 10 shows a program for control processing executed by the control circuit 10.

The operation of the data transmission apparatus will be described with reference to FIG. 10 and a timing chart shown in FIG. 11.

Before the start of operation, no data are stored in the memory circuits 81, 82, and therefore the empty signal fe and the flag f are both set ON. Therefore, the control circuit 10 waits for data to be written into the register circuits 4, 5 at a step S10. When the write signal w2 is applied to the register circuit 5, a time data item $\Delta t(0)$ and a main data item d(0) are simultaneously written into the memory circuits 81 and 82 at respective memory addresses AD(0), while the write address is incremented to AD(1) and at the same time the empty signal fe and the flag f are both set OFF at a step S10. Thus, when the register write signal w2 is generated while the flag f is ON, a memory load signal R(0) is generated by the control signal b0', whereby the time data $\Delta t(0)$ read from the address AD(0) is loaded into the timer circuit 1, and at the same time the main data d(0) read from the address AD(0) is latched into the latch circuit 9, followed by incrementing the read address to AD(1) (step S12). At this time, the main data is not loaded from the latch circuit 9 into the output circuit 3, which prevents erroneous data from being transmitted.

After data are read from the memory circuits 81, 82, it is determined at a step S13 whether or not the memory circuits 81, 82 are empty. In the example shown in FIG. 11, although these circuits 81, 82 once become empty as indicated by symbol A in FIG. 11, the next register write signal w2 is soon generated, whereby a time data item $\Delta t(1)$ and a main data item d(1) are simultaneously written into the memory circuits 81, 82 at respective addresses AD(1), and the write address is incremented to AD(2), canceling the empty state at steps S19 and S20.

When the timer circuit 1 counts down a time interval specified by the time data item $\Delta t(0)$ loaded therein, a time-up signal b0 is generated at a step S15, whereupon the time data item $\Delta t(1)$ read from the read address AD(1) is loaded into the timer circuit 1 to start counting down the next time interval specified thereby, and at the same time the shift clock c generated by the counter circuit 2 has its phase corrected. At the same time, the output circuit 3 has the main data item d(0) loaded thereinto from the latch circuit 9 to start the serial transmission, while the main data item d(1) read from the memory circuit 82 is once latched into the latch circuit 9, and then the read address is incremented to AD(2) (step S17).

Figure 11:
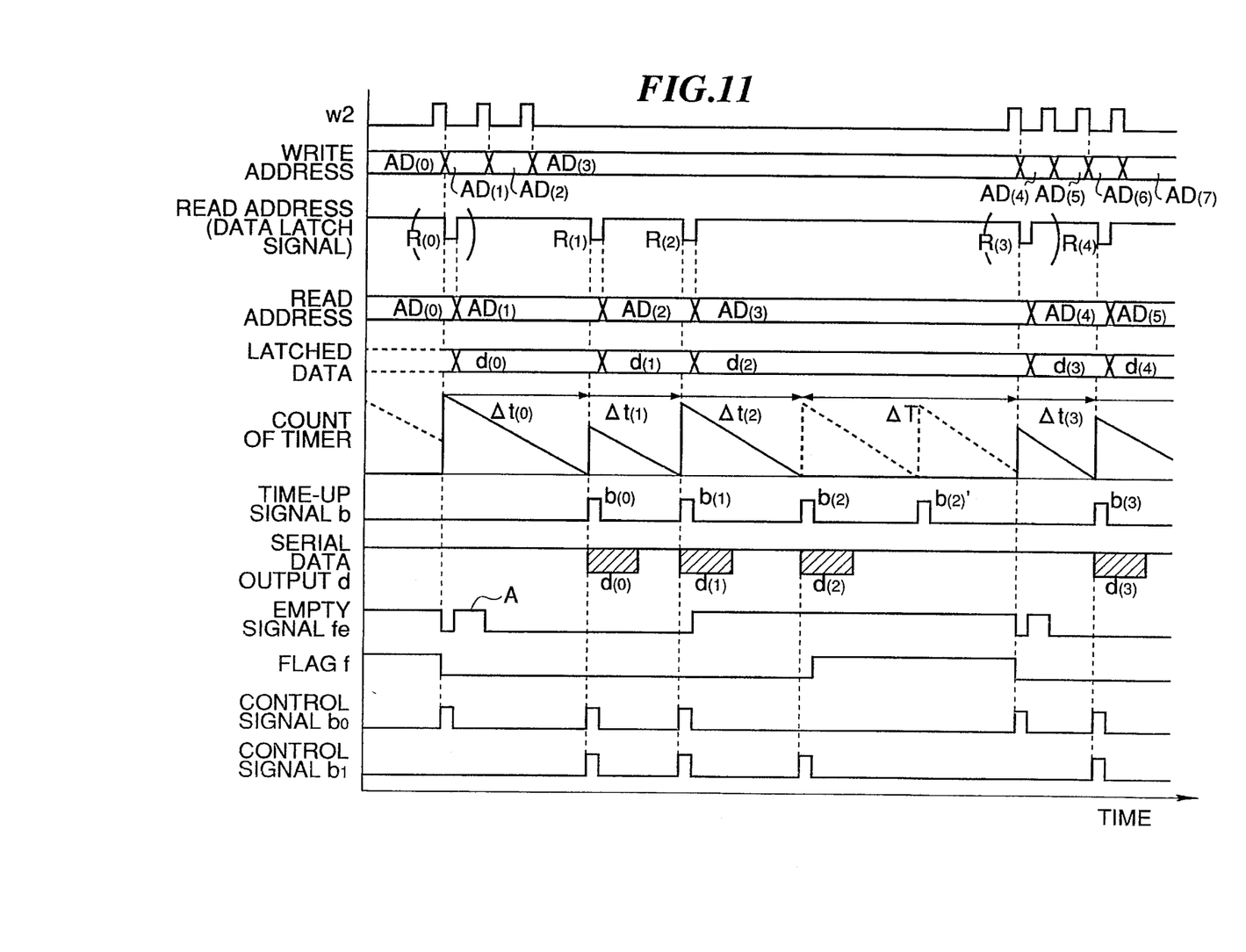
FIG. 11 is a timing chart showing the operation of the FIG. 9 apparatus.

In the example of FIG. 11, a time-up signal b1 is generated to read data from the memory circuits 81, 82, the empty signal fe is generated (step S16) as shown in FIG. 10. When the next time-up signal b2 is subsequently generated in this status, although a main data item d(2) to be serially transmitted is ready to be loaded into the output circuit 1 from the latch circuit 8, the next transmission interval cannot be specified then, and hence the flag f is held ON (step S21→step S18). The flag f means completion of data transmission of one group of data if the data items d(0) to d(2) belong to a data group which is independent of and has no correlation with a data group 15 of subsequent data items d(3) et seq. Otherwise, the transmission interval between the data item d(2) and the item d(3) should be specified as a $\Delta t(3)$, and hence the flag means that there has occurred an error due to delay of the register write signal. The error difference in the transmission interval on this occasion is represented by $\Delta T$ in FIG. 11, which corresponds to a time delay in the inputting of the register write signal.

According to this apparatus, as will be learned from the above, even if an initial resetting or like control is not carried out at the head of a data group, it is automatically reset to an initial state, which is very advantageous in continually transmitting different groups of data.

Further, from the flag f, the CPU can discriminate between completion of transmission of one data group and occurrence of an error in the course of transmission of one data group. Therefore, by utilizing the flag f, it is possible to design a transmission system which is highly reliable.

What is claimed is:

1. A data transmission apparatus comprising:
   a timer circuit disposed to have time data input thereto, said time data specifying a time interval of transmission of main data forming parallel data together with said time data, said timer circuit counting said time interval specified by said time data input thereto to generate a time-up signal upon completion of counting said time interval, and having next one of said time data input thereto upon generation of said time-up signal;
   a transmission clock-generating circuit for frequency-dividing a predetermined system clock to generate a transmission clock signal, said transmission clock-generating circuit being responsive to said time-up signal delivered from said timer circuit, for correcting a phase of said transmission clock signal; and
   a serial data transmission circuit responsive to said time-up signal delivered from said timer circuit, for having said parallel data input thereto, and for converting said parallel data into serial data, based on said transmission clock signal delivered from said transmission clock-generating circuit, to deliver said serial data.

2. A data transmission apparatus according to claim 1, further including control means for determining whether said serial data is being transmitted, and for delaying timing of said inputting of said next one of said time data to said timer circuit, timing of said correction of said phase of said transmission clock signal, and timing of said inputting of said parallel data to said output circuit, until completion of transmission of said serial data, if said serial data is being transmitted when said time-up signal is delivered from said timer circuit.

3. A data transmission apparatus comprising:
   data buffer means for simultaneously storing time data specifying a time interval of transmission of main data and said main data to be transmitted upon lapse said time interval specified by said time data, as a pair of parallel data, and for simultaneously reading out said pair of parallel data therefrom;
   a timer circuit disposed to have input thereto said time data of said pair of said parallel data read out from said data buffer means, said timer circuit counting said time interval specified by said time data input thereto to generate a time-up signal upon completion of counting said time interval, and having next one of said time data input thereto upon generation of said time-up signal;

holding means responsive to said time-up signal, for storing said main data of said pair of said parallel data read out from said data buffer means; and an output circuit responsive to said time-up signal, for having said main data from said holding means input thereto in a parallel manner, and for converting said main data into serial data, to thereby output said serial data.

4. A data transmission apparatus according to claim 3, including:

first register means responsive to a first write signal, for storing said time data of said pair of said parallel data; and second register means responsive to a second write signal, for storing said main data of said pair of said parallel data;

said data buffer means including write address-generating means for generating a write address, and read address-generating means for generating a write address, and wherein said data buffer means reads said time data stored in said first register means and said main data stored in said second register means and updates said write address generated by said write address-generating means, in response to said second write signal, while permitting said reading-out of said time data and said main data and updating said read address generated by said read address-generating means, in response to said time-up signal.

5. A data transmission apparatus according to claim 4, further including control means for determining whether said data buffer means is in an empty state, said control means being responsive to first generation of said time-up signal when said data buffer means is in said empty state, for transferring said main data remaining in said holding means to said output circuit, and then inhibiting transfer of next one of said main data to said output circuit until said data buffer means ceases to be in said empty state.

6. A data transmission apparatus according to claim 4, further including control means for determining whether said data buffer means is in an empty state, said control means being responsive to first writing of said parallel data into said data buffer means when said data buffer means is in said empty state, for immediately reading said parallel data from said data buffer means, to thereby store said time data into said timer circuit and said main data into said hold means, and at the same time inhibiting transfer of said main data from said holding means to said output circuit.

7. A data transmission apparatus according to claim 3, further including control means for determining whether said data buffer means is in an empty state, said control means being responsive to first writing of said parallel data into said data buffer means when said data buffer means is in said empty state, for immediately reading said parallel data from said data buffer means, to thereby store said time data into said timer circuit and said main data into said hold means, and at the same time inhibiting transfer of said main data from said holding means to said output circuit.

8. A data transmission apparatus according to claim 3, further including control means for determining whether said data buffer means is in an empty state, said control means being responsive to first generation of said time-up signal when said data buffer means is in said empty state, for transferring said main data remaining in said holding means to said output circuit, and then inhibiting transfer of next one of said main data to said output circuit until said data buffer means ceases to be in said empty state.

9. A data transmission apparatus according to claim 8, further including second control means for determining whether said data buffer means is in an empty state, said control means being responsive to first writing of said parallel data into said data buffer means when said data buffer means is in said empty state, for immediately reading said parallel data from said data buffer means, to thereby store said time data into said timer circuit and said main data into said hold means, and at the same time inhibiting transfer of said main data from said holding means to said output circuit.

* * * * *